United States Patent
Uchiki et al.

(10) Patent No.: US 9,030,246 B2
(45) Date of Patent: May 12, 2015

(54) SEMICONDUCTOR DEVICE (71) Applicant: Renesas Electronics Corporation, Kawasaki-shi (JP)

(72) Inventors: Hideki Uchiki, Kanagawa (JP); Satoru Kishimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/506,287

(22) Filed: Oct. 3, 2014

(65) Prior Publication Data

US 2015/0022235 A1    Jan. 22, 2015

Related U.S. Application Data (62) Division of application No. 13/769,000, filed on Feb. 15, 2013, now Pat. No. 8,872,564.

(30) Foreign Application Priority Data

Feb. 17, 2012   (JP) .................. 2012-032671

(51) Int. Cl.
| G06F 1/04 | (2006.01) |
| H03K 3/00 | (2006.01) |
| H03K 19/003 | (2006.01) |
| H03K 17/687 | (2006.01) |
| H03K 17/56 | (2006.01) |
| H03K 19/00 | (2006.01) |

(52) U.S. Cl.
CPC ........ H03K 19/00315 (2013.01); H03K 17/687 (2013.01); H03K 17/56 (2013.01); H03K 19/003 (2013.01); H03K 19/0013 (2013.01)

(58) Field of Classification Search
CPC .............. G06F 1/10; G06F 1/04; G06F 1/08; H03K 5/133; H03K 5/135; G11C 7/22

USPC .................................................. 327/291, 299
See application file for complete search history.

(56) References Cited

U.S. PATENT DOCUMENTS

| 7,514,976 B2 | 4/2009 | Kim |
| 7,792,090 B2 | 9/2010 | Choi |
| 2002/0000833 A1 | 1/2002 | Taki |

FOREIGN PATENT DOCUMENTS

| JP | 2006-033058 A | 2/2006 |
| JP | 2006-074746 A | 3/2006 |

OTHER PUBLICATIONS

Non-Final Office Action U.S. Appl. No. 13/769,000 dated Oct. 30, 2013.
Non-Final Office Action U.S. Appl. No. 13/769,000 dated Jan. 16, 2014.
Notice of Allowance U.S. Appl. No. 13/769,000 dated Jun. 24, 2014.

*Primary Examiner* — Lincoln Donovan
*Assistant Examiner* — Diana J Cheng
(74) *Attorney, Agent, or Firm* — McDermott Will & Emery LLP (57) ABSTRACT

The disclosed invention provides a semiconductor device capable of suitably controlling the level of an enable signal to resolve NBTI in a PMOS transistor. An input node receives an input signal alternating between high and low levels during normal operation and fixed to a high level during standby. A detection unit receives a signal through the input node and outputs an enable signal. The detection unit sets the enable signal to a low level upon detecting that the input node remains at a high level for a predetermined period. A signal transmission unit includes a P-channel MOS transistor and transmits a signal input to the input node according to control by the enable signal.

3 Claims, 10 Drawing Sheets

SEMICONDUCTOR DEVICE

CROSS-REFERENCE TO RELATED APPLICATIONS

This Application is a Divisional Application of U.S. Ser. No. 13/769,000 filed Feb. 15, 2013, which claims priority from Japanese Patent Application No. 2012-032671 filed on Feb. 17, 2012, the subject matter of each is incorporated herein by reference in entirety.

BACKGROUND

The present invention relates to a semiconductor device.

It is known that a waveform of pulses that are transmitted sequentially via logic circuits including P-channel MOS transistors is deteriorated by NBTI (Negative Bias Temperature Instability).

NBTI means that a threshold voltage of a PMOS transistor varies by continuous application of a negative gate bias to the PMOS transistor.

For example, in Patent Document 1 (Japanese Published Unexamined Patent Application No. 2006-33058), an embodiment is described in which a two-input NAND circuit is applied for clock gating. This embodiment sets forth that one input of the two-input NAND circuit is fixed to H and that a PMOS influenced by NBTI in the NAND circuit is divided into two parts to distribute the NBTI influence.

A semiconductor device described in Patent Document 2 (Japanese Published Unexamined Patent Application No. 2006-74746) includes a first semiconductor integrated circuit that has a predefined function and outputs a required output signal and a second semiconductor integrated circuit having a plurality of MOS elements that switch between conducting and non-conducting states independently of each other, in response to a plurality of gate signals with shifted timing, the MOS elements being coupled in parallel to the output or input of the first semiconductor integrated circuit. This semiconductor device further includes a pulse generating circuit that generates and outputs the gate signals with shifted timing to the MOS elements in the second semiconductor integrated circuit.

RELATED ART DOCUMENTS

Patent Documents

[Patent Document 1] Japanese Published Unexamined Patent Application No. 2006-33058
[Patent Document 2] Japanese Published Unexamined Patent Application No. 2006-74746

SUMMARY

By the way, such a problem in a serial interface circuit is known that, when a serial clock stops, a negative gate bias is continuously applied to a PMOS transistor. To address this, it is possible to use a circuit scheme in which NAND circuits are cascade coupled and a clock signal is input to one input thereof and an enable signal is applied to the other input thereof, as described in Patent Document 1 and Patent Document 2.

However, there is no description about how to control the level of the enable signal to resolve NBTI in a PMOS transistor.

A semiconductor device according to an embodiment of the present invention includes: an input node that receives an input signal alternating between high and low levels during normal operation and fixed to a high level during standby; a detection unit that sets an enable signal to a low level upon detecting that the input node remains at a high level for a predetermined period; and a signal transmission unit that includes P-channel MOS transistors and transmits a signal input to the input node according to control by the enable signal.

The semiconductor device according to an embodiment of the present invention is capable of suitably setting the level of the enable signal to resolve NBTI in a PMOS transistor.

DETAILED DESCRIPTION

In the following, embodiments of the present invention will be described with reference to the drawings.

First Embodiment

Figure 1:
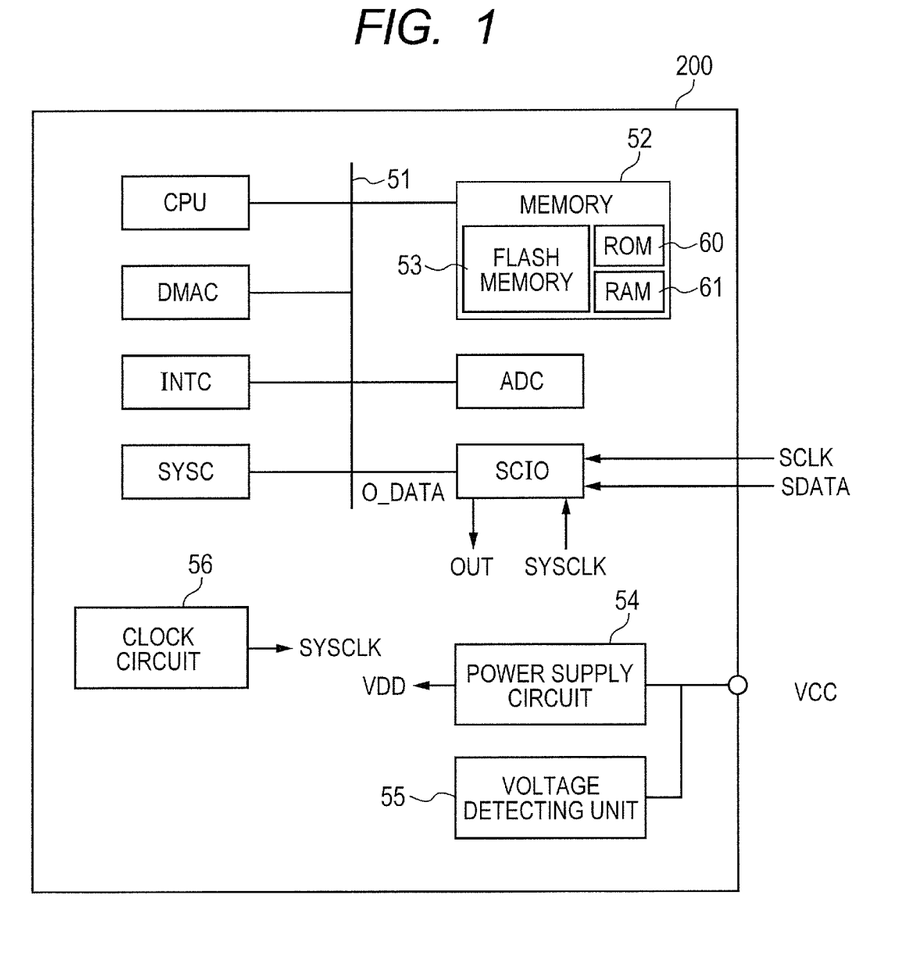
FIG. 1 is a diagram showing a structure of a semiconductor device according to an embodiment of the present invention.

FIG. 1 is a diagram showing a structure of a semiconductor device according to an embodiment of the present invention.

Referring to FIG. 1, the semiconductor device 200 includes a central processing unit CPU, a memory 52, a bus 51 that transfers data and addresses, a data transfer unit (direct memory access controller) DMAC, an analog-digital converter ADC, an interrupt controller INTC, a serial interface circuit SCIO, a system controller SYSC, a clock circuit 56, a power supply circuit 54, and a voltage detecting unit 55.

The memory 52 includes a flash memory 53, a ROM (Read Only Memory) 60, and a RAM (Random Access Memory) 61. The memory 52 stores data and programs.

The central processing unit CPU sequentially executes programs stored in the memory 52 and controls operation of the semiconductor device 200 as a whole.

The serial interface circuit SCIO stores externally input data into the memory 52. The serial interface circuit SCIO receives a serial clock SCLK and serial data SDATA from outside.

The analog-digital converter ADC converts an externally input analog signal to a digital value and stores it into the memory 52.

The data transfer unit DMAC controls data transfer via the bus 51, when storing digital data from the serial interface circuit SCIO or the analog-digital converter ADC into the memory 52.

The interrupt controller INTC receives an interrupt signal issued externally or by an internal functional unit and generates an interrupt to the central processing unit CPU. The central processing unit CPU performs a processing task requested by the interrupt.

The clock circuit 56 includes a plurality of clock sources. The clock circuit 56 generates a system clock SYSCLK and supplies it to each functional unit of the semiconductor device 200.

The power supply circuit 54 steps down an external supply voltage VCC, generates an internal operating voltage VDD or the like, and supplies it to each component in the semiconductor device 200.

The voltage detecting unit 55 has a power-on reset circuit POR that generates a reset signal triggering a power-on reset action in response to a voltage change of the external supply voltage VCC and a voltage drop detecting circuit LVD that generates an interrupt signal or reset signal in response to a voltage drop of the external supply voltage VCC.

The system controller SYSC controls operation of the semiconductor device 200 as a whole. The system controller SYSC controls supplying a clock and a power supply voltage to each of the functional blocks (that is, load circuits) including the CPU in the semiconductor device 200.

Figure 2:
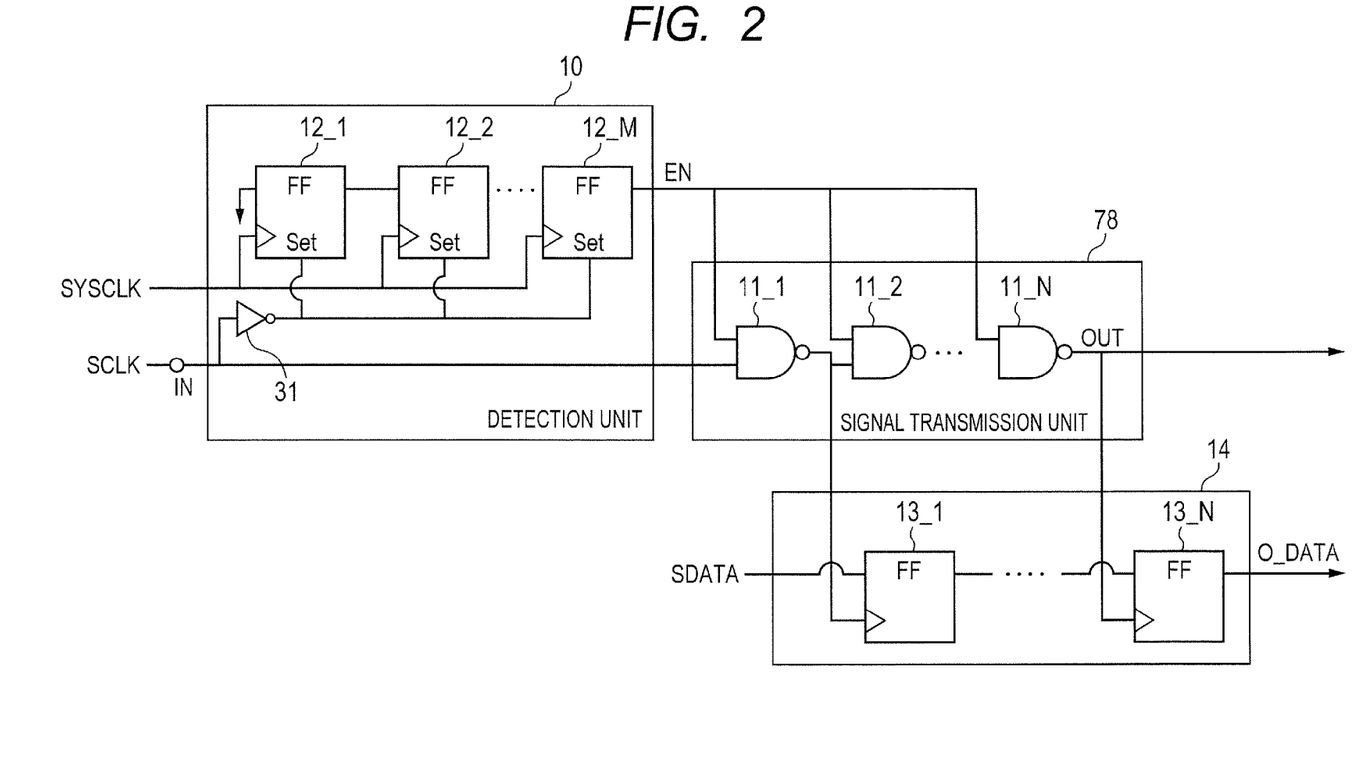
FIG. 2 is a diagram showing a structure of a digital circuit included in a serial interface circuit SCIO according to a first embodiment.
Figure 3:
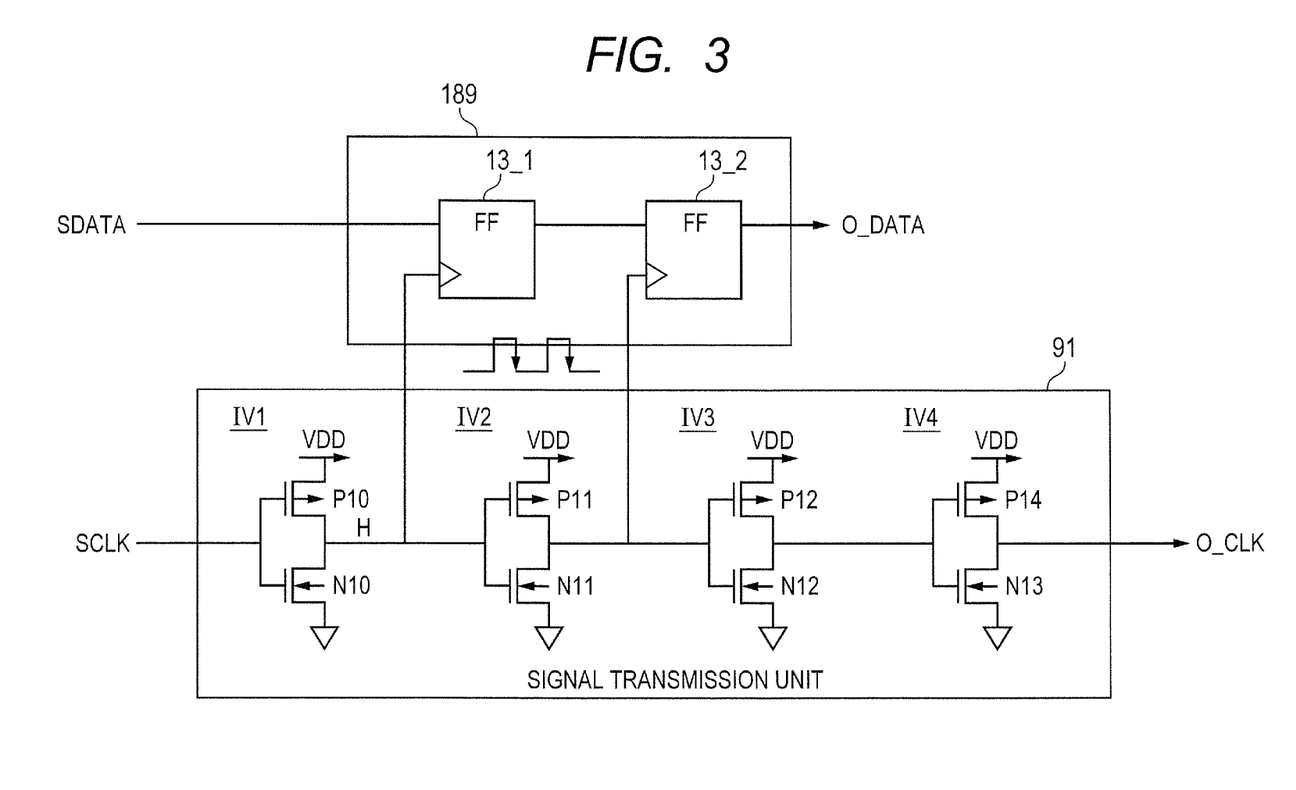
FIG. 3 is a diagram showing a reference example of a digital circuit.

FIG. 2 is a diagram showing a structure of a digital circuit included in the serial interface circuit SCIO according to the first embodiment. FIG. 3 is a diagram showing a reference example of a digital circuit. First, the reference example of FIG. 3 is described.

Referring to FIG. 3, a signal transmission unit 91 includes a plurality of stages of inverters IV1 to IV4 and sequentially delays a serial clock SCLK. A data path unit 189 includes a plurality of stages of flip-flops 13_1 to 13_2 and transmits serial data SDATA.

A signal that is output from an inverter IV1 is input to a clock terminal of a flip-flop 13_1. A signal that is output from an inverter IV2 is input to a clock terminal of a flip-flop 13_2.

During standby, when the serial clock SCLK remains at an "H" level for a long time, NBTI occurs in a P-channel MOS transistor P11. Specifically, the threshold voltage of the P-channel MOS transistor P11 rises. The NBTI occurring in the P-channel MOS transistor P11 deteriorates the duty ratio of the clock that is output from the inverter IV2. In consequence, the clock having a deteriorated duty ratio will be transmitted to the following stage.

If NBTI occurs in a P-channel MOS transistor P14, it further deteriorates the duty of the clock that is output from an inverter IV4. In consequence, the clock having a further deteriorated duty ratio will be transmitted to the following stage.

In this way, in the signal transmission unit 91 configured with a plurality of stages of inverters, the duty of the clock that is output from an inverter placed in a later stage is more deteriorated. In consequence, in the data path unit 189, a flip-flop at a later stage undergoes a decrease in a setup margin.

Referring to FIG. 2, this digital circuit includes an input node IN, a detection unit 10, a signal transmission unit 78, and a data path unit 14.

The data path unit 14 outputs serial data DATA to outside in accordance with a clock that is output from the signal transmission unit 78. The data path unit 14 includes a plurality of stages of flip-flops 13_1 to 13_N and transmits serial data SDATA.

The input node IN receives a serial clock SCLK as an input signal. The serial clock SCLK is fixed to an "H" level during standby.

The signal transmission unit 78 includes a plurality of stages of NAND circuits 11_1 to 11_N and sequentially delays and transmits the serial clock SCLK in accordance with control by an enable signal EN that is output from the detection unit 10.

One input terminal of a NAND circuit 11_1 is coupled to the input node IN. The other input terminal of the NAND circuit 11_1 receives the enable signal EN. When the enable signal EN is at an "L" level, the NAND circuit 11_1 always outputs an "H" level irrespective of the level of the serial clock SCLK.

One input terminal of a NAND circuit 11_2 is coupled to the output of the NAND circuit 11_1. The other input terminal of the NAND circuit 11_2 receives the enable signal EN. When the enable signal EN is at an "L" level, the NAND circuit 11_2 always outputs an "H" level irrespective of the level of the serial clock SCLK.

Figure 4:
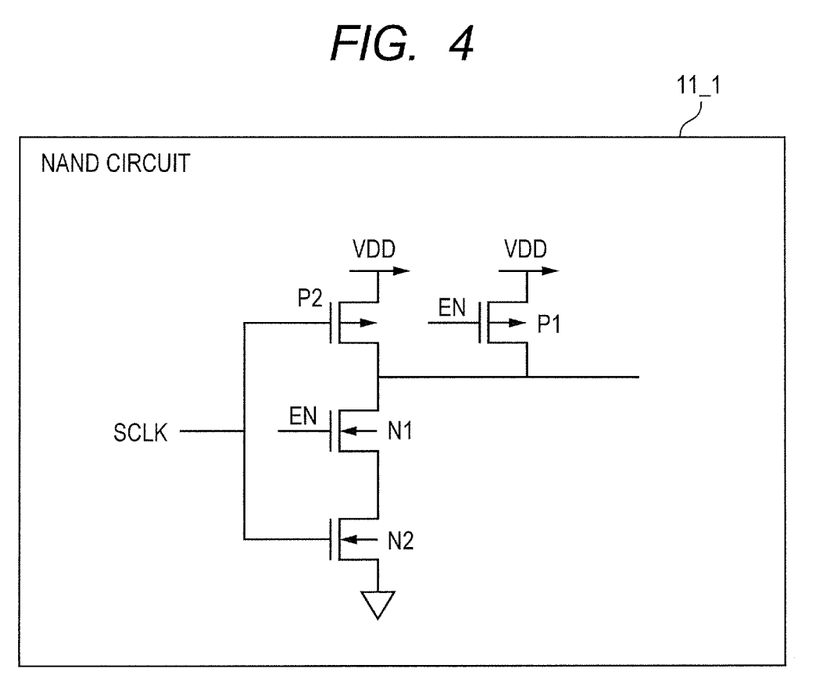
FIG. 4 is a diagram showing a structure of a NAND circuit 11_1 shown in FIG. 3.

NAND circuits 11_3 to 11_N also operate in the same way as above. FIG. 4 is a diagram showing a structure of a NAND circuit 11_1 in FIG. 3. NAND circuits 11_2 to 11_N also have the same structure as shown here.

The NAND circuit includes P-channel MOS transistors P1, P2, and N-channel MOS transistors N1, N2.

An N-channel MOS transistor N2 and a P-channel MOS transistor P2 receive the serial clock SCLK. NBTI does not occur in the P-channel MOS transistor P2, because the level of the serial clock SCLK during standby is "H" level.

In the NAND circuits 11_2 to 11_N as well, because the signal that is output from a NAND circuit at the preceding stage is "H" level, NBTI does not occur in the P-channel MOS transistor P2 in the NAND circuits 11_2 to 11_N.

An N-channel MOS transistor N1 and a P-channel MOS transistor P1 receive the enable signal EN. If the enable signal EN changes to an "L" level during standby, NBTI occurs in the P-channel MOS transistor P1. However, when the signal is transmitted, that is, when the level of the serial clock SCLK changes, the P-channel MOS transistor P1 does not operate and, therefore, does not become a factor of deteriorating the waveform.

Referring to FIG. 2 again, the detection unit 10 receives the serial clock SCLK from the input node IN. When the detection unit 10 detects that the serial clock SCLK is at an "H" level for a predetermined period, it sets the enable signal EN to an L level.

The detection unit 10 is configured with a shift register that performs a shift operation based on the system clock SYSCLK. By its overflow, the shift register sets the enable signal EN to an "L" level. The shift register resets the shift operation when the serial clock SYSCLK level has changed to "L".

Specifically, the detection unit 10 includes an inverter 31 coupled to the input node IN and a plurality of stages of D type flip-flops 12_1 to 12_M. The above predetermined period is the frequency of the system clock SYSCLK×the number M of the D type flip-flops 12_1 to 12_M.

A set terminal of each of the D type flip-flops 12_1 to 12_M is coupled to the output of the inverter 31 and its level changes depending on the serial clock SCLK.

The system clock SYSCLK is input to a clock terminal of each of the D type flip-flops 12_1 to 12_M.

An input terminal of a D type flip-flop 12_1 at a first stage receives a signal fixed to an "L" level. An input terminal of D type flip-flops 12_2 to 12_M at second and subsequent stages receives an output of a D type flip-flop at the preceding stage. From a D type flip-flop 12_M at the last stage, the enable signal EN is output.

Figure 5:
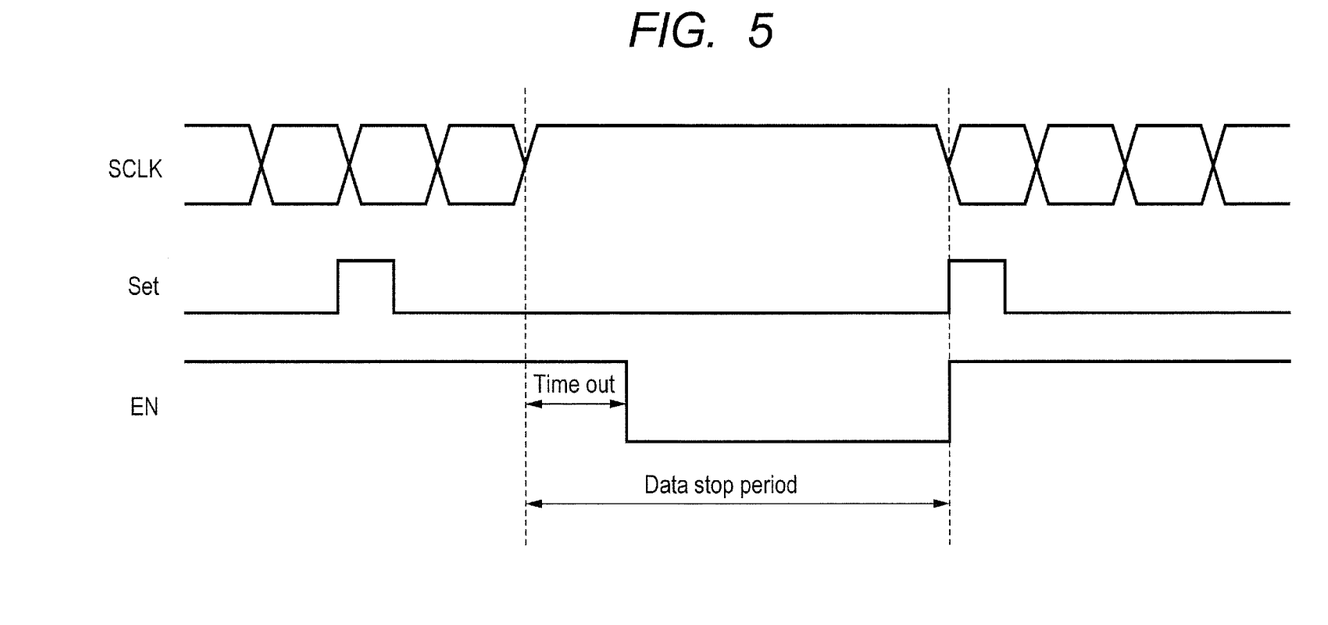
FIG. 5 is a timing chart for explaining the operation of the first embodiment.

FIG. 5 is a timing chart for explaining the operation of the first embodiment. During normal operation, as the level of the serial clock SCLK cyclically changes between "H" and "L" levels, the level of the set terminal Set of each of the D type flip-flops 12_1 to 12_M iteratively changes between "H" and "L" levels. In consequence, the enable signal EN remains at an "H" level. On the other hand, as the level of the serial clock SCLK cyclically changes between "H" and "L" levels, the level of one input terminal of each of the stages of NAND circuits 11_1 to 11_N in the signal transmission unit 91 iteratively changes between "H" and "L" levels. In consequence, NBTI does not occur in the P-channel MOS transistor P2 comprised in each of the NAND circuits 11_1 to 11_N.

During standby, when the serial clock SCLK is fixed to an "H" level, the level of the set terminal Set of each of the D type flip-flops 12_1 to 12_M remains at an "L" level. When the level of the set terminal Set remains at the "L" level for a predetermined time, the enable signal EN changes to an "L" level. In consequence, the level of the other input terminal of each of the stages of NAND circuits 11_1 to 11_N in the signal transmission unit 91 changes to an "L" level. Consequently, all the stages of NAND circuits 11_1 to 11_N output an "H" level, so that NBTI does not occur in the P-channel MOS transistor P2 comprised in each of the NAND circuits 11_1 to 11_N.

As above, according to the present embodiment, the signal transmission unit is comprised of the stages of NAND circuits and the other input terminal of each of the NAND circuits is to change to the "L" level when a period in which the serial clock SCLK remains at the "H" level has exceeded the predetermined time. Thereby, it is possible to avoid NBTI in the PMOS transistors for signal transmission comprised in the NAND circuits.

Besides, because the system clock SYSCLK that is input to the detection unit is allowed to be adequately slower than the serial clock SCLK, power consumed by the detection unit can be reduced.

Second Embodiment

Figure 6:
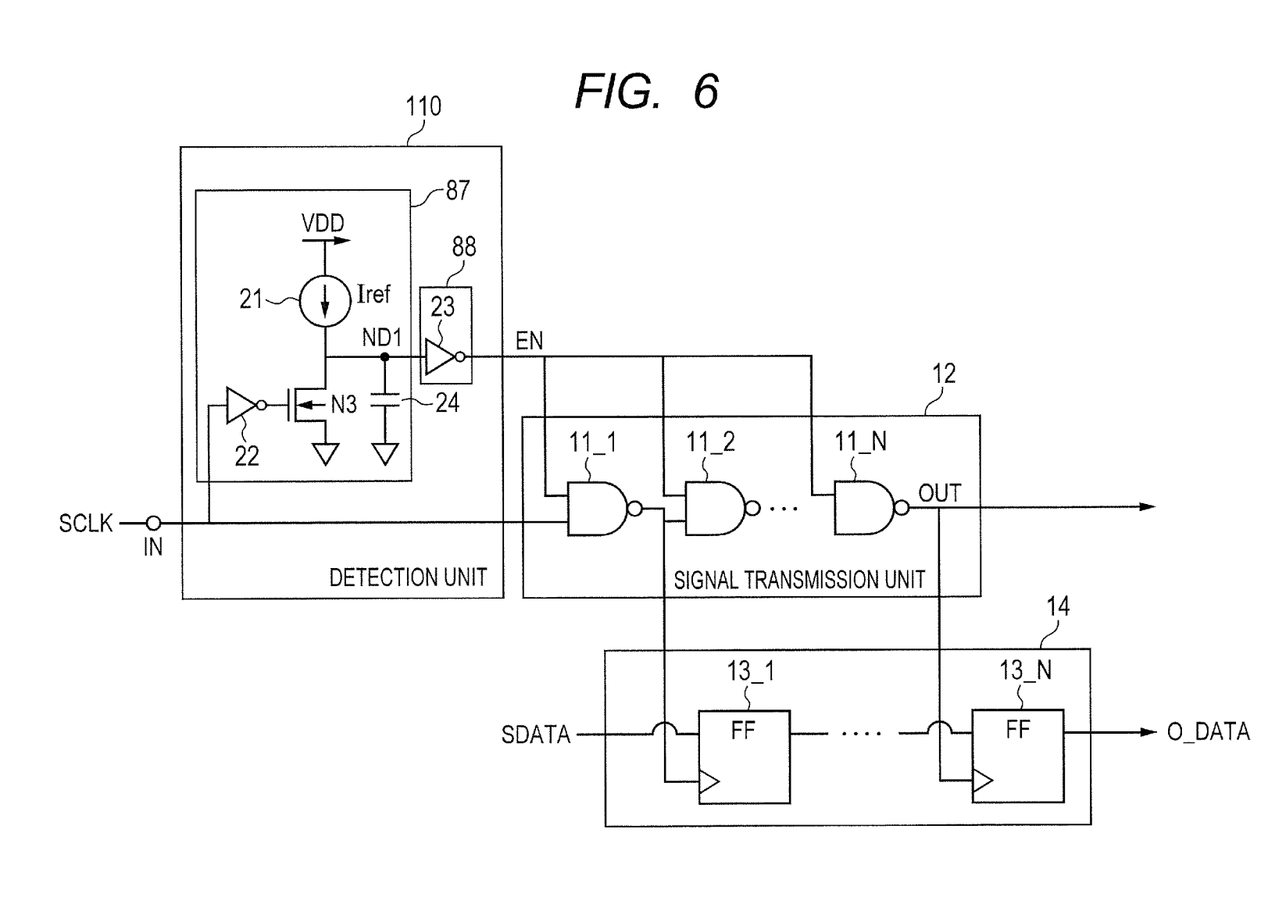
FIG. 6 is a diagram showing a structure of a digital circuit included in a serial interface circuit SCIO according to a second embodiment.

FIG. 6 is a diagram showing a structure of a digital circuit included in a serial interface circuit SCIO according to a second embodiment.

A point of difference of this digital circuit from the digital circuit of the first embodiment is a detection unit 110. This detection unit 110, in this embodiment, is configured with a time constant circuit including a constant current source and a capacitor.

Specifically, the detection unit 110 includes a charging unit 89 in which an amount of charge stored therein varies depending on a duty ratio of the serial clock SCLK and an output unit 88 that sets the level of the enable signal EN based on whether or not an amount of charge stored in the charging unit 89 exceeds a predetermined threshold value.

The charging unit 89 includes an inverter 22, a constant current source 21, an NMOS transistor N3, and a capacitive element 24.

The inverter 22 receives the serial clock SCLK. The constant current source 21 supplies current to a node ND1. The NMOS transistor N3 is installed between the node ND1 and ground, receives the serial clock SCLK at its gate, and ON/OFF controlled in response to the serial clock SCLK.

The capacitive element 24 is installed between the node ND1 and ground. The output unit 88 includes an inverter 23 that receives a voltage of the node ND1. The inverter 23 outputs an L-level enable signal EN, if the voltage of the node ND1 exceeds a logical threshold voltage of the inverter. The inverter outputs an H-level enable signal EN, if the voltage of the node ND1 is equal to or less than the logical threshold voltage of the inverter 23.

Figure 7:
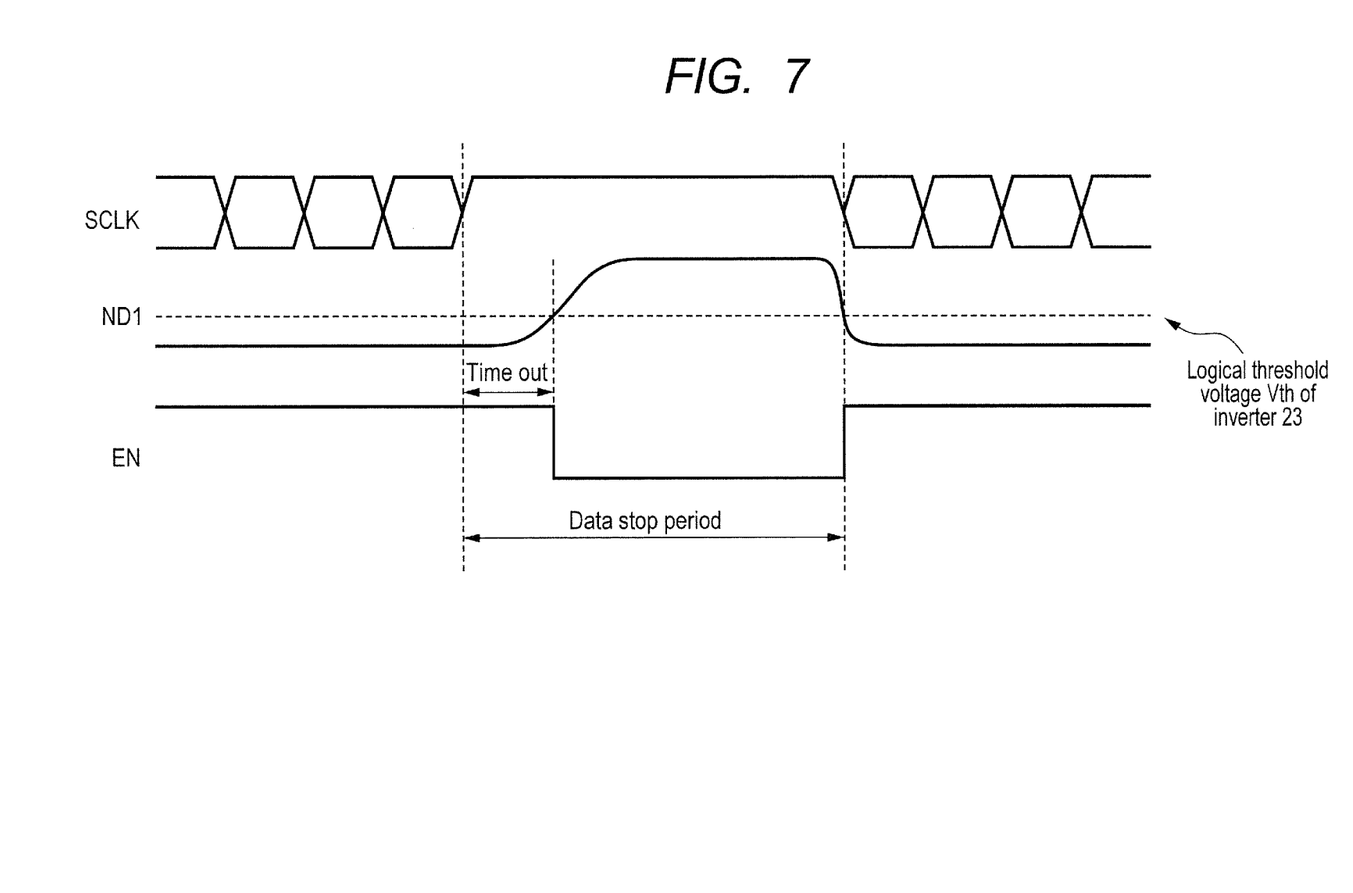
FIG. 7 is a timing chart for explaining the operation of the second embodiment.

FIG. 7 is a timing chart for explaining the operation of the second embodiment. During normal operation, as the level of the serial clock SCLK cyclically changes between "H" and "L" levels, the N-channel MOS transistor N3 is cyclically switched between ON and OFF. Thereby, the capacitive element 24 is charged and discharged iteratively, so that an increase in the potential of the node ND1 does not rise to an observable level. Thus, the potential of the node ND1 does not exceed the logical threshold voltage Vth of the inverter 23 and the enable signal EN is at an "H" level.

During standby, when the serial clock SCLK is fixed to an "H" level, the N-channel MOS transistor is turned off by the inverter 22. Inconsequence, current that is output from the constant current source 21 flows via the node ND1 into the capacitive element 24 and the capacitive element 24 is charged. As the capacitive element 24 is charged continuously, the potential of the node ND 1 increases. When a period in which the serial clock SCLK is fixed to the "H" level exceeds a predetermined time and when the potential of the node ND1 has exceeded the logical threshold voltage Vth of the inverter 23, the enable signal changes to an "L" level.

As above, in the present embodiment, the other input terminal of each of the NAND circuits changes to the "L" level when a period in which the serial clock SCLK remains at the "H" level has exceeded the predetermined time, as is the case for the first embodiment, and it is possible to avoid NBTI in the PMOS transistors for signal transmission comprised in the NAND circuits.

Besides, because no system clock SYSCLK is required in the present embodiment, it becomes possible to further reduce power consumption. It may be expedient to provide both the detection unit 10 of the first embodiment and the detection unit 110 of the second embodiment. In this case, an OR circuit may be provided that outputs a logical sum of an enable signal EN which is output from the detection unit 10 of the first embodiment and an enable signal which is output from the detection unit 110 of the second embodiment and an output of the OR circuit may be supplied to the signal transmission unit.

Third Embodiment

Figure 8:
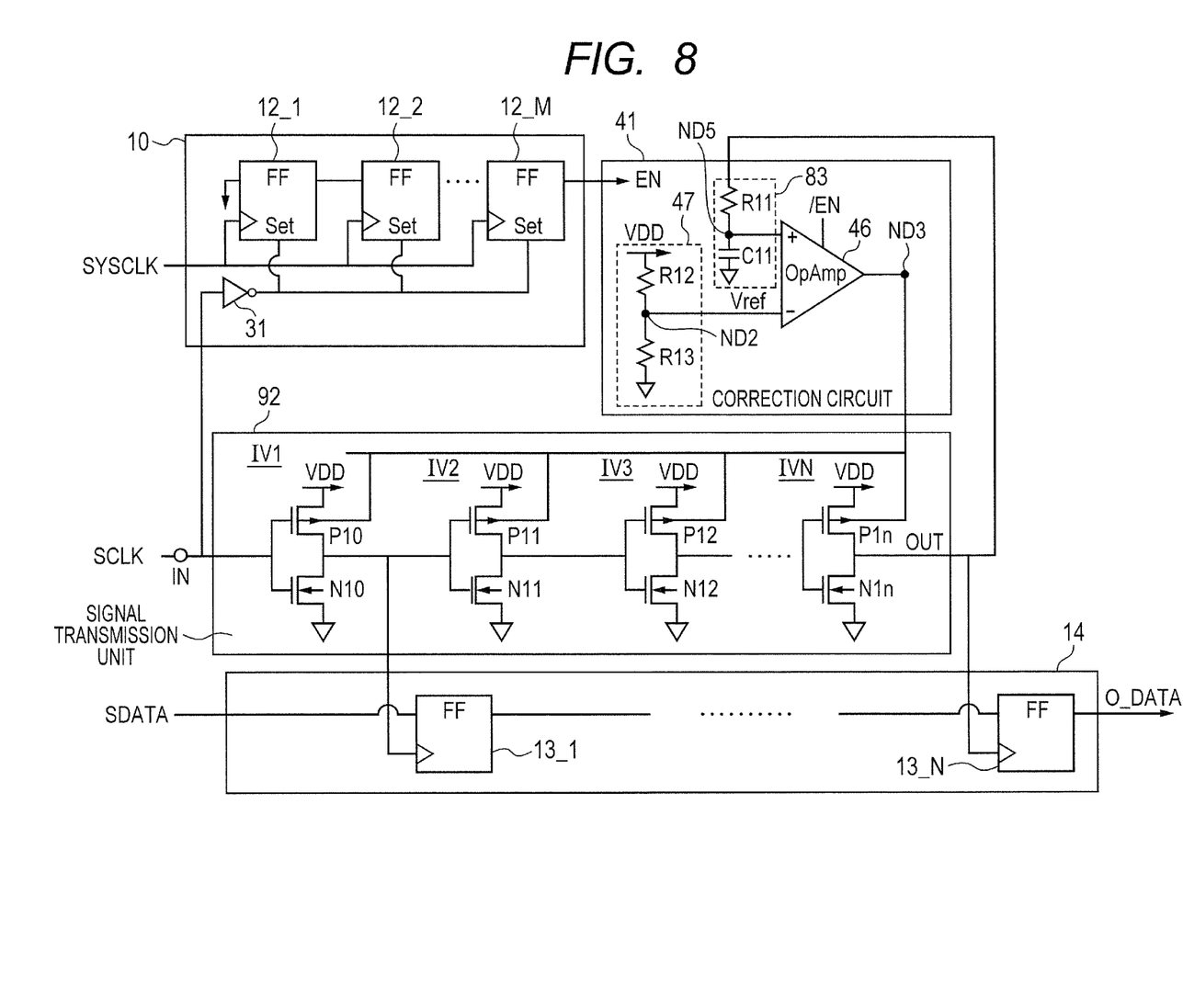
FIG. 8 is a diagram showing a structure of a digital circuit included in a serial interface circuit SCIO according to a third embodiment.

FIG. 8 is a diagram showing a structure of a digital circuit included in a serial interface circuit SCIO according to a third embodiment.

This digital circuit differs from the digital circuit of the first embodiment in two points: a correction circuit 41 that it includes additionally and a signal transmission unit 92.

The signal transmission unit 92 is comprised of a plurality of stages of inverters IV1 to IVN to transmit a serial clock SCLK input to the input node IN, as described with regard to the reference example for the first embodiment. As described with regard to the reference example for the first embodiment, when the serial clock SCLK remains at an "H" level for a long time, an "L" level voltage is applied for a long time to P-channel MOS transistors P11, P13, . . . at even stages and NBTI occurs therein.

It is the correction circuit 41 to solve this problem. The correction circuit 41 controls the back gates of the P-channel MOS transistors P11, P13, . . . , in which NBTI occurs, depending on the duty ratio a signal that is output from an inverter IVN at the last stage. Through this control, the correction circuit 41 controls the threshold voltages of the P-channel MOS transistors P11, P13, . . . comprised in the inverters at even stages.

Specifically, the correction circuit 41 is configured with a reference voltage generating circuit 47 comprised of resistive dividers, a filter 83, and a differential amplifier 46 whose inputs are coupled to the filter 83 and the reference voltage generating circuit 47 and whose output is coupled to the back gates of the P-channel MOS transistors P11, P13, . . . comprised in the inverters at even stages.

The reference voltage generating circuit 47 includes resistors R12 and R13 coupled in series between a VDD power supply terminal and ground. A reference voltage Vref (=VDD/2) of a node ND2 between the resistors R12 and R13 is input to a negative input terminal of the differential amplifier 46.

The filter 83 includes a resistor R11 installed between a node ND5 and the output of the inverter IVN at the last stage in the signal transmission unit 92 and a capacitive element C11 installed between the node ND5 and ground. By the filter 83, the node ND 5 has a voltage produced by integrating the output voltage OUT of the inverter IVN at the last stage. The potential of the node ND5 is input to a positive input terminal of the differential amplifier 46.

The differential amplifier 46 amplifies a difference between the voltage of the node ND5 and the reference voltage Vref of the node ND2 and applies an amplified voltage to the back gates of the PMOS transistors P11, P13, etc. That is, the differential amplifier 46 controls the voltage that is applied to the back gates of the PMOS transistors P11, P13, . . . so that the voltage of the node ND5 and the reference voltage Vref become equal.

An unbalanced duty ratio of the serial clock SCLK makes the voltage of the node ND5 smaller than the reference voltage Vref. This results in a decrease in the voltage of the output gate ND3 of the differential amplifier 46, coupled to the back gates of the PMOS transistors P11, P13, . . . . This in turn decreases the threshold voltages Vth, which increased due to NBTI, of the PMOS transistors P11, P13, . . . comprised in the inverters at even stages.

Figure 9:
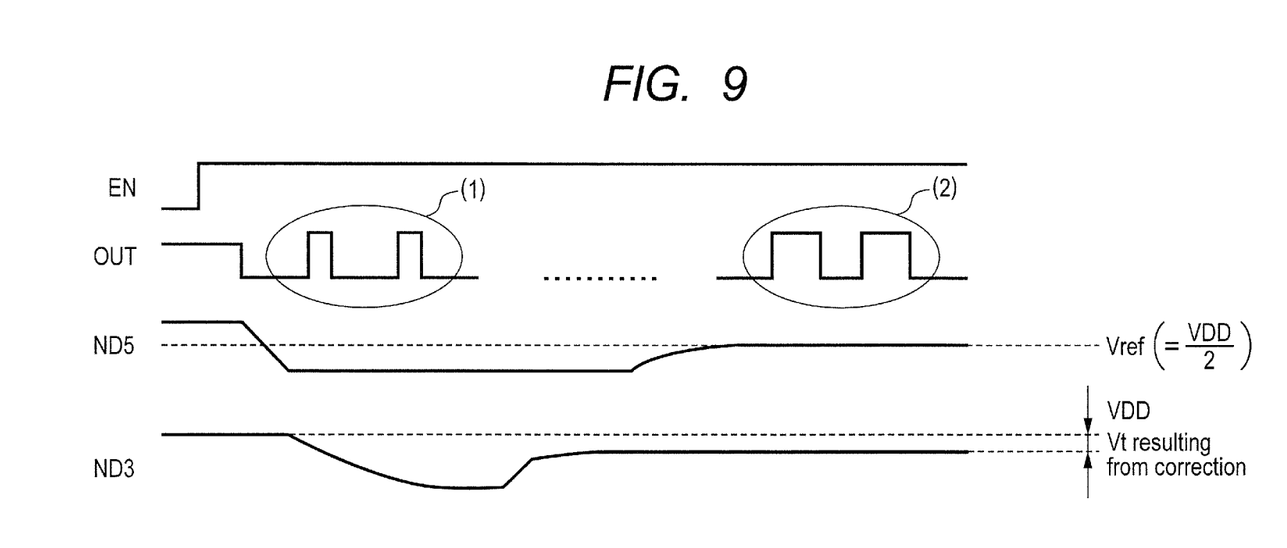
FIG. 9 is a timing chart for explaining the operation of the third embodiment.

FIG. 9 is a timing chart for explaining the operation of the third embodiment. During standby, when the serial clock SCLK remains at an "L" level for a long time, an "L" level voltage is applied for a long time to the P-channel MOS transistors P11, P13, . . . comprised in the inverters at even stages and NBTI occurs therein. As a result, this deteriorates the duty ratio of the voltage OUT of the inverter IVN. At this time, the voltage of the node ND5 becomes smaller than the reference voltage Vref (VDD/2). This results in a decrease in the potential of the output node ND3 of the differential amplifier 46. Because the node ND3 is coupled to the back gates of the PMOS transistors P11, P13, . . . , this in turn decreases the threshold voltages Vth of the PMOS transistors P11, P13, . . . . In consequence, the threshold voltages Vth of the PMOS transistors P11, P13, . . . , which increased due to NBTI, can recover.

As above, in the present embodiment, in a case in which the threshold voltages of PMOS transistors comprised in the inverters in the signal transmission unit increase and NBTI should occur therein during standby, it is possible to stop NBTI from occurring by decreasing the threshold voltages of these PMOS transistors.

Figure 10:
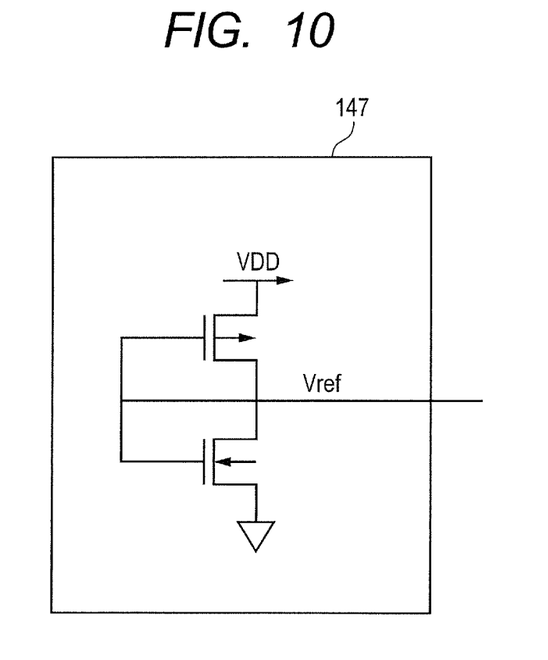
FIG. 10 is a diagram showing a modification example of a reference voltage generating circuit.

In the present embodiment, the reference voltage generating circuit 47 of a resistive divider type is used, but this is not to be regarded as limiting; it may be of a type that generates a local threshold voltage, as shown in FIG. 10.

In the present embodiment, because the serial clock SCLK is at an "H" level during standby, the correction circuit was arranged to control the back gate voltages of PMOS transistors comprised in inverters at even stages among the stages of inverters, depending on a duty ratio of a signal that is output from an inverter at the last stage. If the serial clock SCLK is at an "L" level during standby, the correction circuit can be arranged to control the back gate voltages of PMOS transistors comprised in inverters at odd stages among the stages of inverters, depending on a duty ratio of a signal that is output from an inverter at the last stage.

Although the signal transmission unit in the present embodiment is comprised of a plurality of stages of inverters, the signal transmission unit may be comprised of a plurality of stages of NAND circuits, as is the case for the first and second embodiments.

The embodiments disclosed herein should be considered as illustrative in all respects, rather than restrictive. The scope of the present invention is indicated by the appended claims, rather than by the foregoing descriptions, and all changes which come within the meaning and range of equivalency of the claims are therefore intended to be embraced therein.

What is claimed is:

1. A semiconductor device comprising
   an input node that receives an input signal alternating between high and low levels during normal operation and fixed to a high level during standby;
   a detection unit that sets an enable signal to a low level upon detecting that the input node remains at a high level for a predetermined period; and
   a signal transmission unit that includes P-channel MOS transistors and transmits a signal input to the input node according to control by the enable signal,
   wherein the signal transmission unit comprises:
      a first NAND circuit with one input coupled to the input node and the other input coupled to an output of the detection unit; and
      a second NAND circuit with one input coupled to an output of the first NAND circuit and the other input coupled to the output of the detection unit, and
   wherein the input signal is a first clock that is input from outside the semiconductor device and remains at a high level during standby, and
   wherein the detection unit comprises:
      a charging unit in which an amount of charge stored therein varies depending on a duty ratio of the first clock input to the input node; and
      an output unit that sets the level of the enable signal based on whether or not an amount of charge stored in the charging unit exceeds a predetermined threshold value.

2. The semiconductor device according to claim 1,
   wherein the charging unit comprises:
      a constant current source that supplies current to a first node;
      a MOS transistor that is installed between the first node and ground and on/off controlled in response to the first clock; and
      a capacitive element installed between the first node and ground,
   wherein the output unit comprises an inverter that receives a voltage of the first node and the predetermined threshold value is a logical threshold voltage of the inverter.

3. A semiconductor device comprising:
   an input node that receives an input signal alternating between high and low levels during normal operation and fixed to a high level during standby;

a detection unit that sets an enable signal to a low level upon detecting that the input node remains at a high level for a predetermined period; and a signal transmission unit that includes P-channel MOS transistors and transmits a signal input to the input node according to control by the enable signal, wherein the signal transmission unit comprises a plurality of stages of inverters to transmit a signal input to the input node, and wherein the semiconductor device further comprises a correction circuit that controls back gate voltages of PMOS transistors comprised in inverters at even stages among the stages of inverters, depending on a duty ratio of a signal that is output from an inverter at the last stage.

* * * * *